(12) United States Patent
Mieno

(10) Patent No.: US 9,419,057 B2
(45) Date of Patent: Aug. 16, 2016

(54) RESISTIVE RANDOM ACCESS MEMORY DEVICE AND MANUFACTURING METHODS

(71) Applicants: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

(72) Inventor: Fumitake Mieno, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/846,634

(22) Filed: Sep. 4, 2015

(65) Prior Publication Data

US 2016/0087009 A1    Mar. 24, 2016

(30) Foreign Application Priority Data

Sep. 23, 2014    (CN) .......................... 2014 1 0490040

(51) Int. Cl.
*G11C 13/02*    (2006.01)
*H01L 27/24*    (2006.01)
*H01L 45/00*    (2006.01)
*H01L 29/49*    (2006.01)
*G11C 13/00*    (2006.01)
*H01L 29/51*    (2006.01)

(52) U.S. Cl.
CPC ........ *H01L 27/2463* (2013.01); *H01L 45/1233* (2013.01); *H01L 45/1253* (2013.01); *H01L 45/146* (2013.01); *H01L 45/147* (2013.01); *H01L 45/1616* (2013.01); *G11C 13/0002* (2013.01); *G11C 13/0004* (2013.01); *G11C 2213/31* (2013.01); *H01L 29/4966* (2013.01); *H01L 29/517* (2013.01)

(58) Field of Classification Search
CPC ........... G11C 13/0002; G11C 13/0004; G11C 2213/31; H01L 29/4966; H01L 29/517
USPC .......................................... 365/148, 158, 163
See application file for complete search history.

(56) References Cited

U.S. PATENT DOCUMENTS

| | | | | |
|---|---|---|---|---|
| 8,435,854 | B1* | 5/2013 | Malhotra | .......... H01L 27/10852 257/E21.008 |
| 2012/0294072 | A1* | 11/2012 | Loke | ................. G11C 11/5678 365/163 |
| 2012/0305880 | A1* | 12/2012 | Zhang | ................ G11C 13/0007 257/4 |
| 2013/0113079 | A1* | 5/2013 | Malhotra | ................ H01L 28/60 257/532 |

* cited by examiner

*Primary Examiner* — Ly D Pham
(74) *Attorney, Agent, or Firm* — Kilpatrick Townsend & Stockton LLP

(57) ABSTRACT

A resistive memory storage device includes a lower electrode, an upper electrode and a plurality of composite material layers disposed between the lower electrode and the upper electrode. Each composite material layer includes a first layer and a second layer. The first layer is a metal-based high-K dielectric material layer having a first metal element, and the second layer is a metal layer having the first metal element.

20 Claims, 5 Drawing Sheets

RESISTIVE RANDOM ACCESS MEMORY DEVICE AND MANUFACTURING METHODS

CROSS-REFERENCES TO RELATED APPLICATIONS

This application claims priority to Chinese patent application No. 201410490040.9, filed on Sep. 23, 2014, the content of which is incorporated herein by reference in its entirety.

BACKGROUND OF THE INVENTION

The present invention relates to the field of semiconductor technology. Specifically, embodiments of the invention are directed to resistive memory device structure and its manufacturing methods for a resistive random access memory (RRAM).

Resistive random access memory (RRAM) is a rewritable memory technology that can significantly improve the durability and data transfer speed. In an RRAM, each resistive-type memory cell is capable of storing one bit of data. Each memory cell has a large conductive bridge between the upper and lower electrodes. The conductive bridge forms a conductive path, which, depending on the applied voltage, can switch between a conducting state and a non-conducting state. This property can be used to store information.

Compared with the spin-transfer torque magnet resistance RAM (STT-MRAM), RRAM has similar retention times and reading times, but RRAM has a higher programming current and a longer programming time higher than STT-MRAM. For example, RRAM usually has approximately 1E-4A programming current and about 50 ns programming time. In contrast, STT-MRAM usually has approximately 1E-5A programming current and about 10 ns programming time.

BRIEF SUMMARY OF THE INVENTION

In embodiments of the present invention, a resistive memory device structure and its manufacturing method are provided that can lower the programming current and shorten programming time in a resistive RAM (RRAM).

According to some embodiments of the present invention, a resistive memory storage device includes a lower electrode, an upper electrode and a plurality of composite material layers disposed between the lower electrode and the upper electrode. Each composite material layer includes a first layer and a second layer. The first layer is a metal-based high-K dielectric material layer having a first metal element, and the second layer is a metal layer having the first metal element.

In an embodiment of the above device, in each composite material layer, the first layer is disposed on the second layer. In another embodiment, in each composite material layer, the second layer is disposed on the first layer. In some embodiments, the device also has an additional metal layer having the first metal element. In some embodiments, the plurality of composite material layers comprises three or more of the composite material layers. In some embodiments, the high-K dielectric material layer has a dielectric constant that is higher than the dielectric constant of silicon dioxide. In some embodiments, the first metal comprises one or more of hafnium (Hf), Rhodium (Rh), Barium (Ba), or Aluminum (Al). In some embodiments, the first metal is Hf, and the high-K dielectric material is $HfO_2$. In some embodiments, the first metal is Titanium (Ti), and the high-K dielectric material is $TiO_2$. In some embodiments, the first metal is Aluminum (Al), and the high-K dielectric material is $Al_2O_3$. In some embodiments, the first metal is lawrencium (La), and the high-K dielectric material is $La_2O_3$. In some embodiments, the first metal is Hf, and the high-K dielectric material is nitrided hafnium silicates (HfSiON). In some embodiments, each of the upper electrode and the lower electrode comprises TiN, TaN, Cu, or Al. In some embodiments, each of the metal layer and the high-K dielectric material layer is characterized by a thickness of less than 5 nm. In some embodiments, each high-K dielectric material layer has a thickness of 1 nm, and each of the metal layer has a thickness of 2 nm.

According to some embodiments, a method for forming a resistive memory storage device includes forming a lower electrode on a substrate, and forming a plurality of composite material layers overlying lower electrode and the upper electrode. Each composite material layer includes a first layer and a second layer. The first layer is a metal-based high-K dielectric material layer having a first metal element, and the second layer is a metal layer having the first metal element. The method also includes forming an upper electrode over the plurality of composite material layers.

In some embodiments, in each composite material layer, the first layer is formed on the second layer. In some embodiments, in each composite material layer, the second layer is disposed on the first layer. In some embodiments, the method also includes forming an additional metal layer having the first metal element over the plurality of composite material layers. In some embodiments, the first metal is Hf, and the high-K dielectric material is $HfO_2$. In some embodiments, the first metal is Ti, and the high-K dielectric material is $TiO_2$. In some embodiments, the first metal is Al, and the high-K dielectric material is $Al_2O_3$. In some embodiments, the first metal is La, and the high-K dielectric material is $La_2O_3$. In some embodiments, the first metal is Hf, and the high-K dielectric material is nitrided hafnium silicates (HfSiON). In some embodiments, the first layer and the second layer are formed using an atomic layer deposition (ALD) process.

According to an alternative embodiment of the present invention, a resistive random access memory (RRAM) includes a plurality of bit lines, a plurality of word lines, and an array of memory cells. Each memory cell is coupled to one of the plurality of bit lines and one of the plurality of word lines. In some embodiments, each memory cell includes a resistive memory storage device that includes a lower electrode, an upper electrode and a plurality of composite material layers disposed between the lower electrode and the upper electrode. Each composite material layer includes a first layer and a second layer. The first layer is a metal-based high-K dielectric material layer having a first metal element, and the second layer is a metal layer having the first metal element.

The following description, together with the accompanying drawings, will provide further understanding of the nature and advantages of the claimed invention.

DETAILED DESCRIPTION OF THE INVENTION

Figure 1:
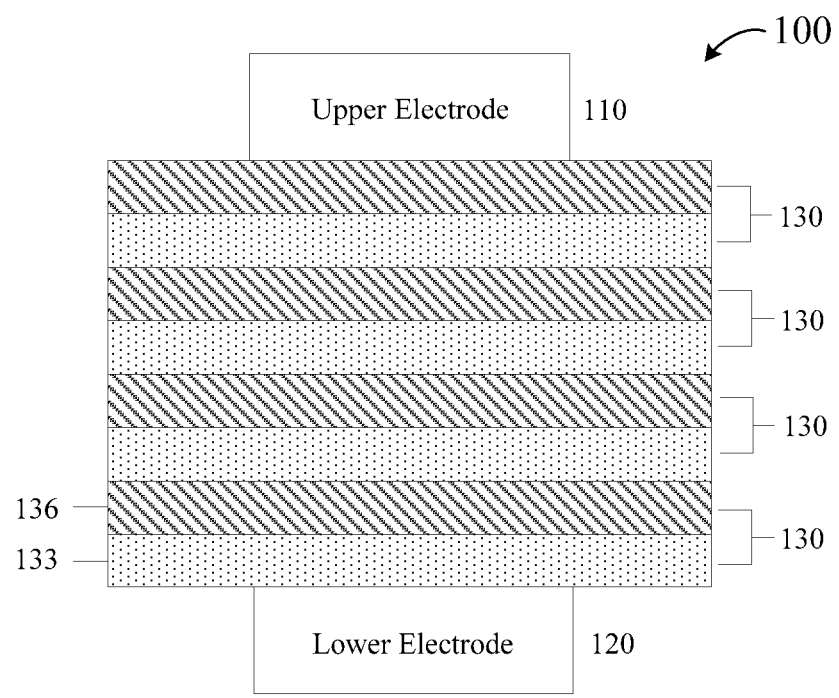
FIG. 1 is a cross-sectional view diagram of a resistive memory device structure according to an embodiment of the present invention.

Exemplary embodiments of the present invention will be described with reference to the figures. The following description of exemplary embodiments is illustrative only, and not intended to be any limitation on the invention and its application or use. It is understood that the relative arrangement of parts and steps and numeric expressions set forth in these embodiments are not to be construed as limiting the scope of the invention. It is also understood that, for convenience of description, the size of the various components shown in the drawings are not necessarily drawn to actual proportional relationship. Techniques, methods and devices known to one of ordinary skill in the relevant art may not be discussed in detail, but in situations in which these techniques, methods and apparatus apply, these techniques, methods and apparatus should be considered as part of this specification. Further, similar reference numerals and letters are used to refer to similar items in the following figures, and once an item is defined in one of the figures, it will not need to be explained further in the subsequent figures.

FIG. 1 is a cross-sectional view diagram of a resistive memory device structure according to an embodiment of the present invention. As shown in FIG. 1, resistive memory device or cell 100 can be used as an element in an RRAM array. Each resistive memory device, such as 100, can be used to store one bit of binary information. Resistive type memory cell 100 includes an upper electrode 110 and a lower electrode 120. Between the upper electrode 110 and lower electrode 120 is disposed a plurality of composite material layer 130, which forms a repetitive structure. Although FIG. 1 shows four repetitions of composite layer structure 130, the number of composite layers is not limited to four layers. According to an embodiment of the present invention, the number of repeating composite structure may be not less than 3 layers. In some embodiments, the memory cell can have two composite layers 130. A voltage can be applied between upper electrode 110 and lower electrode 120 can change the properties of the composite material layer to open or block a current flow path. This change in resistance in the cell allows one bit of information be stored in the resistive memory cell 100.

In FIG. 1, upper electrode 110 and lower electrode 120 may be formed of TiN, TaN, Cu, Al, and the like. Composite material layer 130 includes a stack of a high dielectric material layer 133 and a metal layer 136. Depending on the embodiment, the relative position of high dielectric material layer 133 and metal layer 136 can be interchanged. For example, in FIG. 1, metal layer 136 is disposed adjacent to upper electrode 110 and high dielectric material layer 133 is disposed adjacent to lower electrode 120. In other embodiments, the position of high dielectric material layer 133 and metal layer 136 can be reversed. In that case, metal layer 136 can be disposed adjacent to lower electrode 120 and high dielectric material layer 133 is disposed adjacent to upper electrode 110.

High dielectric material layer 133 may include a metal element (may also be referred to as containing a metal) and has a larger dielectric constant than the dielectric constant of silicon dioxide. High dielectric material layer 133 may be an oxide of any one of the rare earth elements, e.g., Hf, Rh, Ba, Al, and other elements. For example, high dielectric materials may be $HfO_2$, $TiO_2$, $La_2O_3$, or $Al_2O_3$, etc., which can be used as the oxidant.

Metal layer 136 is made up by the metal element that forms the high dielectric material layer 133, and it can be used as a reducing agent. For example, when the high dielectric material is $HfO_2$, the metal is Hf. Similarly, when the high dielectric materials are $TiO_2$, the metal is Ti.

To form a shorter conductive path, each of the metal layer and the high-K dielectric material layer is characterized by a thickness of less than 5 nm in some embodiments. In some alternative embodiments, each of the metal layer and the high-K dielectric material layer is characterized by a thickness of less than 3 nm. In some embodiments, each high-K dielectric material layer has a thickness of 1 nm, and each of the metal layer has a thickness of 2 nm.

The multiple composite material layers 130 can provide many small electrically conductive paths between the upper electrode 110 and the lower electrode 120. It can enable faster switching between the conducting state and the non-conducting state, so that the programming current can be decreased, and the programming time can be reduced.

Figure 2:
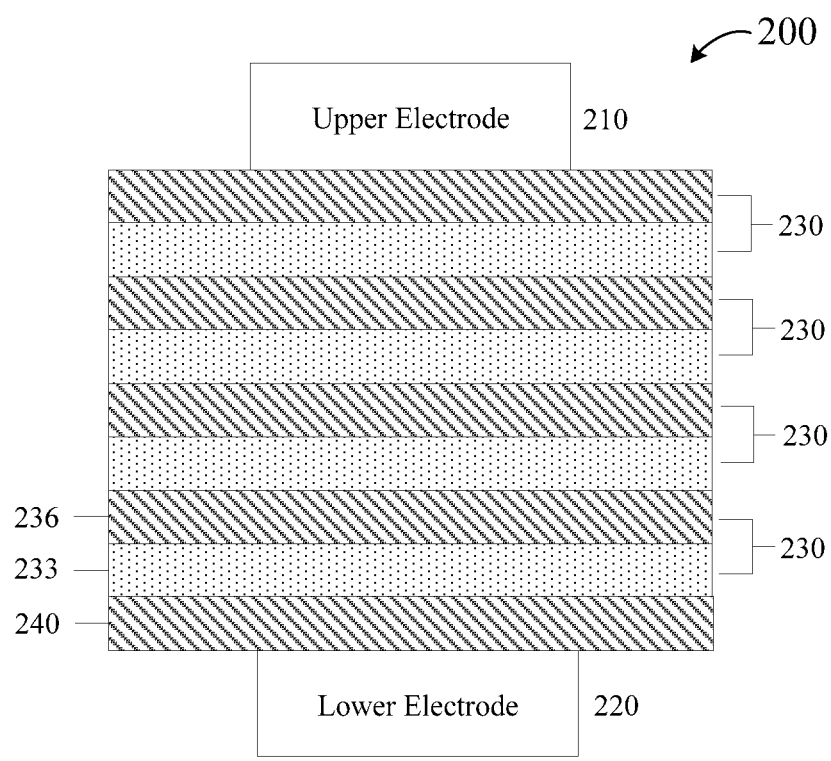
FIG. 2 is a cross-sectional view diagram of a resistive memory device structure according to another embodiment of the present invention.

FIG. 2 is a cross-sectional view diagram of a resistive memory device structure according to another embodiment of the present invention. Resistive memory cell or resistive memory device 200 is similar to resistive memory device or resistive memory cell 100 of FIG. 1. As shown, resistive type memory cell 200 includes an upper electrode 210 and a lower electrode 220. Between the upper electrode 210 and lower electrode 220 is disposed a plurality of composite material layer 230, which forms a repetitive structure. Composite material layer 230 includes a stack of a high dielectric material layer 233 and a metal layer 236. The structure and material properties are similar to those in FIG. 1 and are not repeated here.

It is noted that in FIG. 2, resistive-type memory cell 200 further includes an additional metal layer 240. Metal layer 240 may be formed of the same metal material of the metal layer 233. As shown in FIG. 2, additional metal layer 240 is adjacent to lower electrode 220 at one surface, and it is adjacent to a high dielectric material layer 233 at the other surface. In alternative embodiments, the position of the high dielectric material layer and the metal layer can be reversed. In this case, a metal layer 236 is adjacent to lower electrode 220. Then, the additional metal layer 240 would be disposed at the top, and additional metal layer 240 would be adjacent to the upper electrode. Additional metal layer 240 would also be adjacent to a high dielectric material layer 233 of the repetitive stacked structure.

Depending on the embodiments, the thickness of additional metal layer 240 can be less than 5 nm. Alternatively, the thickness of additional metal layer 240 can be less than 3 nm. For example, the thickness of additional metal layer 240 can be 2 nm.

According to embodiments of the present invention, a resistive memory RRAM array may include a plurality of resistive memory device 100 or 200. The array structure and interconnection between the memory cells are similar to known memory array technologies, and are not explained in detail here.

Figure 3:
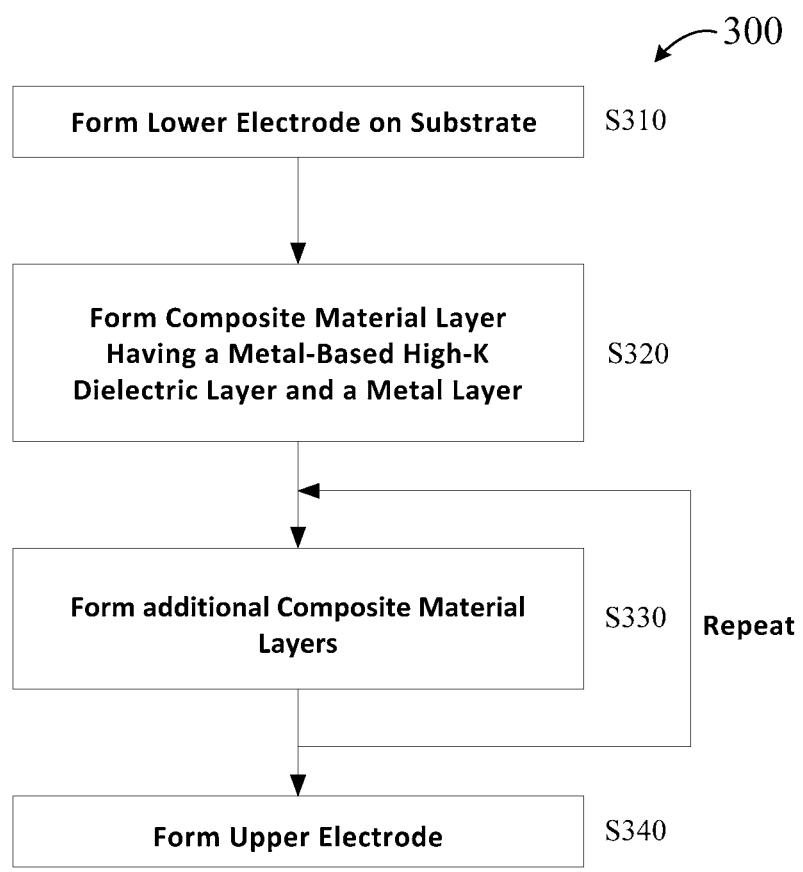
FIG. 3 is a simplified flowchart of a method for manufacturing a resistive memory device structure according to another embodiment of the present invention.

FIG. 3 is a simplified flowchart of a method for manufacturing a resistive memory device structure according to another embodiment of the present invention. FIGS. 4A to 4D are cross-sectional view diagrams illustrating a method for forming a resistive memory device structure according to an embodiment of the present invention. The method will now be explained with reference to FIG. 3 and FIGS. 4A-4D.

First, method 300 in FIG. 3 includes the following steps.
Step S310: Form a lower electrode on a substrate;
Step S320: Form a composite material layer;
Step S330 Form additional composite layers; and
Step S340: Form an upper electrode.

Figure 4A:
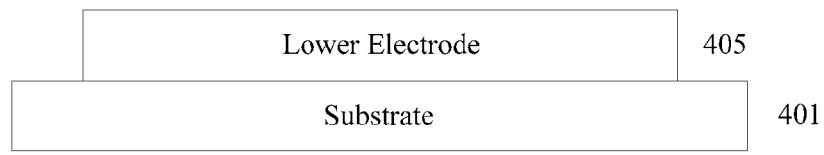
FIGS. 4A to 4D are cross-sectional view diagrams illustrating a method for forming a resistive memory device structure according to an embodiment of the present invention.

At step S310, as shown in FIG. 4A, a lower electrode 405 is formed on a substrate 401. Substrate 401 may be a silicon substrate having an insulating layer. In an embodiment, low electrode 405 can be an TiN layer. The TiN layer can be deposited on substrate 401 by atomic layer deposition (ALD) technology at a temperature of 520 degrees Celsius, a pressure of 0.1 Torr, in an ambient $TiCl_4$, $NH_3$, and Ar. Alternatively, the TiN layer can be deposited on substrate 401 by Physical Vapor Deposition (PVD) technology using Ti sputtering at a power of 300 W, a pressure of 0.01 Torr, in an ambient of $NH_3$. In addition to TiN, TaN, Cu, Al, etc., can also be used as the lower electrode 405.

At step S320, a high dielectric material layer and a metal layer are formed in sequence on the lower electrode. Alternatively, the metal layer and the high dielectric material layer are sequentially deposited. Both layers can be formed using ALD or PVD technologies.

Figure 4B:
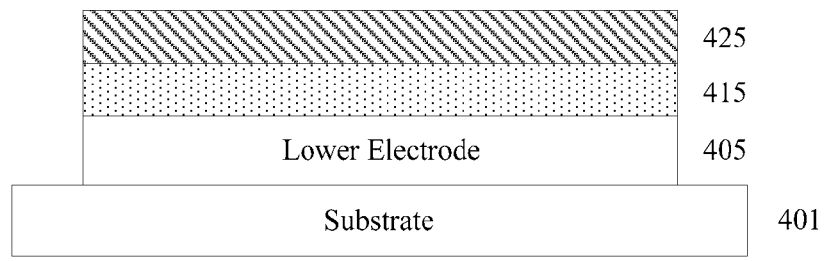

In an embodiment, as shown in FIG. 4B, an $HfO_2$ layer 415 is deposited on the lower electrode TiN layer 405 by ALD technique. For example, $HfO_2$ can be deposited by ALD at a temperature of 350 degrees Celsius, a pressure of 0.1 Torr state, in $HfC_{14}$, $O_3$, and Ar ambient.

Next, an Hf metal layer 425 is deposited on $HfO_2$ high dielectric material layer 415 by ALD technology. For example, Hf can be deposited on $HfO_2$ at a temperature of 350 degrees Celsius, the pressure is 0.1 Torr, in an $HfCl_4$ and Ar atmosphere. As described above, the thickness of the $HfO_2$ and Hf layers are less than 5 nm or 4 nm. In addition to ALD technology, the $HfO_2$ layer and the Hf layer can also be deposited by PVD technology.

At step S330, a plurality of composite layers are deposited on the previously deposited metal layer or high dielectric material layer. Each composite layer includes a high dielectric material layer and a metal layer. Depending on the top layers deposited at step S320, the sequence of metal layer and a high dielectric material layer deposition at step S330 can be adjusted.

Figure 4C:
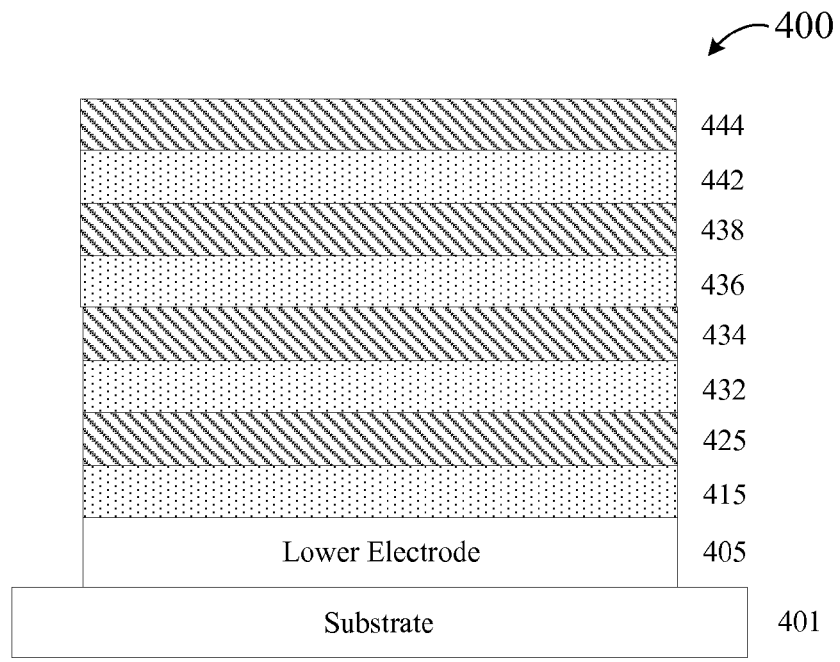

For example, in some embodiments, the deposition of the composite material layer as described is carried out at least twice at step S330. In other words, the following layers are sequentially deposited over lower electrode 415: high dielectric material layer->metal layer->high dielectric material layer->metal layer-> . . . ->high dielectric material layer->metal layer, etc. Alternatively, the following layers can be sequentially deposited over lower electrode 415: ->metal layer->high dielectric material layer->metal layer->high dielectric material layer-> . . . ->metal layer->high dielectric material layer. As shown in FIG. 4C, an ALD technology is used to deposit $HfO_2$ layer 432, Hf layer 434, $HfO_2$ layer 436, Hf layer 438, $HfO_2$ layer 442, and Hf layer 444.

Figure 4D:
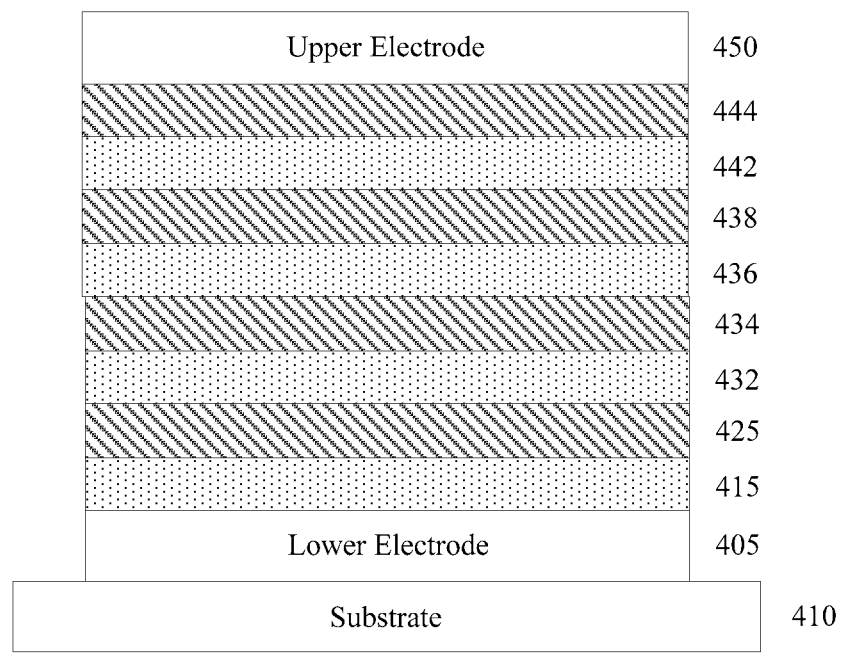

At step S340, as shown in FIG. 4D, TiN upper electrode 450 is deposited on the Hf layer 444. In other embodiments, the positions of $HfO_2$ layer and Hf layer can be interchanged. In either case, a multiple-layer structure having alternate high dielectric material layer and metal layer is formed between the upper electrode and the lower electrode.

Next, further processing of the structure in FIG. 4D can be carried out. For example. the upper electrode, the multiple composite material layers, and the lower electrode can be etched to form an RRAM memory element. Depending on the embodiments, each layer can be etched after deposition to tailor the thickness of each layer. In some embodiments, the size of the upper electrode and the lower electrode can be different. In some embodiments, the size of each layer in the multiple-layer composite material structure can be the same.

According to an embodiment of the present invention, an integer number of the repeat structure, also referred to as the composite material layer, consisting of high dielectric material layer and metal layer can be disposed between the upper and lower electrodes. Furthermore, one or more additional metal layers may also be disposed between the upper and lower electrodes. For example, after step S330, if the last-deposited layer is a high dielectric material layer, an additional metal layer can be deposited before the upper electrode is formed. In this case, the resistive type memory cell structure includes the following layers: lower electrode metal layer->high dielectric material layer->metal layer->high dielectric material layer->metal layer-> . . . ->high dielectric material layer->metal layer->upper electrode metal layer.

In order to verify the performance, resistive type memory cell structure has to be fabricated according to a method described above. The memory structure includes the following layers: TiN (lower electrode)->$HfO_2$ layer (high dielectric layer)->Hf layer (metal layer)->$HfO_2$ layer->Hf layer->$HfO_2$ layer->Hf layer->$HfO_2$ layer->Hf layer->TiN (upper electrode). In this memory device, the $HfO_2$ layer has a thickness of 1 nm, and the Hf layer has a thickness of 2 nm. The performance of the resistive type memory cell is measured and confirmed that the programming current is reduced to 1E-5A, and the programming time is reduced to 10 ns. Thus, embodiments of the invention provide device structures and manufacturing methods for forming resistive type memory devices that can offer lower programming current and shorter programming time compared with conventional devices and methods.

Although certain embodiments of the present invention are described in detail, those skilled in the art will appreciate that the above examples are for illustration only and not to limit the scope of the invention. Thus, those skilled in the art would appreciate that, aside from embodiments of the present disclosure, various modifications and changes can be made without departing from the spirit and scope of the present disclosure.

What is claimed is:

1. A resistive memory storage device, comprising:
    a lower electrode;
    an upper electrode;
    a plurality of composite material layers disposed between the lower electrode and the upper electrode, each composite material layer including a first layer and a second layer, wherein:
        the first layer is a metal-based high-K dielectric material layer having a first metal element; and
        the second layer is a metal layer including the first metal element.

2. The device of claim 1, wherein, in each composite material layer, the first layer is disposed on the second layer.

3. The device of claim 1, wherein, in each composite material layer, the second layer is disposed on the first layer.

4. The device of claim 1, further comprising an additional metal layer having the first metal element.

5. The device of claim 1, wherein the plurality of composite material layers comprises three or more of the composite material layers.

6. The device of claim 1, wherein the high-K dielectric material layer has a dielectric constant that is higher than the dielectric constant of silicon dioxide.

7. The device of claim 1, wherein the first metal comprises one or more of Hf, Rh, Ba, or Al.

8. The device of claim 1, wherein:
    the first metal is Hf, and the high-K dielectric material is $HfO_2$; or
    the first metal is Ti, and the high-K dielectric material is $TiO_2$; or the first metal is Al, and the high-K dielectric material is Al$_2$O$_3$; or the first metal is La, and the high-K dielectric material is La$_2$O$_3$.

9. The device of claim 1, wherein the first metal is Hf, and the high-K dielectric material is nitrided hafnium silicates (HfSiON).

10. The device of claim 1, wherein each of the upper electrode and the lower electrode comprises TiN, TaN, Cu, or Al.

11. The device of claim 1, wherein each of the metal layer and the high-K dielectric material layer is characterized by a thickness of less than 5 nm.

12. The device of claim 1, wherein each high-K dielectric material layer has a thickness of 1 nm, and each of the metal layer has a thickness of 2 nm.

13. A method for forming a resistive memory storage device, comprising:
   forming a lower electrode on a substrate;
   forming a plurality of composite material layers overlying lower electrode and the upper electrode, each composite material layer including a first layer and a second layer, wherein:
      the first layer is a metal-based high-K dielectric material layer having a first metal element; and
      the second layer is a metal layer having the first metal element; and
   forming an upper electrode over the plurality of composite material layers.

14. The method of claim 13, wherein, in each composite material layer, the first layer is formed on the second layer.

15. The method of claim 13, wherein, in each composite material layer, the second layer is disposed on the first layer.

16. The method of claim 13, further comprising forming an additional metal layer having the first metal element over the plurality of composite material layers.

17. The method of claim 13, wherein:
   the first metal is Hf, and the high-K dielectric material is HfO$_2$; or
   the first metal is Ti, and the high-K dielectric material is TiO$_2$; or
   the first metal is Al, and the high-K dielectric material is Al$_2$O$_3$; or
   the first metal is La, and the high-K dielectric material is La$_2$O$_3$.

18. The method of claim 13, wherein the first metal is Hf, and the high-K dielectric material is nitrided hafnium silicates (HfSiON).

19. The method of claim 13, wherein the first layer and the second layer are formed using an atomic layer deposition (ALD) process.

20. A resistive random access memory (RRAM), comprising:
   a plurality of bit lines;
   a plurality of word lines;
   an array of memory cells, each memory cell coupled to one of the plurality of bit lines and one of the plurality of word lines;
   wherein each memory cell comprises a resistive memory storage device that includes:
      a lower electrode;
      an upper electrode;
      a plurality of composite material layers disposed between the lower electrode and the upper electrode, each composite material layer including a first layer and a second layer,
      wherein:
         the first layer is a metal-based high-K dielectric material layer having a first metal element; and
         the second layer is a metal layer having the first metal element.

* * * * *